(12) United States Patent
Katsube et al.

(10) Patent No.: US 8,525,584 B2
(45) Date of Patent: Sep. 3, 2013

(54) AUTOMATIC CUTOFF FREQUENCY ADJUSTING CIRCUIT AND PORTABLE DIGITAL ASSISTANT

(75) Inventors: Yusaku Katsube, Yokohama (JP); Yutaka Igarashi, Yokohama (JP); Akio Yamamoto, Hiratsuka (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 32 days.

(21) Appl. No.: 13/180,303

(22) Filed: Jul. 11, 2011

(65) Prior Publication Data

US 2012/0007667 A1 Jan. 12, 2012

(30) Foreign Application Priority Data

Jul. 12, 2010 (JP) ................................. 2010-157703

(51) Int. Cl.
*H03K 5/00* (2006.01)

(52) U.S. Cl.
USPC ........................................ 327/554; 327/552

(58) Field of Classification Search
USPC ................... 327/551–559, 336–337
See application file for complete search history.

(56) References Cited

U.S. PATENT DOCUMENTS

| | | | |
|---|---|---|---|
| 7,002,404 B2* | 2/2006 | Gaggl et al. .................. | 327/553 |
| 7,019,586 B2* | 3/2006 | Dong ........................... | 327/553 |
| 7,078,961 B2* | 7/2006 | Punzenberger et al. ...... | 327/553 |
| 7,477,098 B2* | 1/2009 | Dharmalinggam et al. .. | 327/553 |
| 7,742,893 B2* | 6/2010 | Confalonieri et al. ........ | 702/107 |

FOREIGN PATENT DOCUMENTS

JP 2009-94734 A 4/2009

OTHER PUBLICATIONS

Thomas H. Lee, *The Design of CMOS Radio-Frequency Integrated Circuits*, Cambridge University Press, Jan. 1998, pp. 554-555.

* cited by examiner

*Primary Examiner* — Dinh T. Le
(74) *Attorney, Agent, or Firm* — Miles & Stockbridge P.C.

(57) ABSTRACT

The disclosed invention enables the cutoff frequency of a filter to be automatically adjusted to an arbitrary setting value within the adjustment range. An automatic cutoff frequency adjusting circuit includes a voltage/current converter circuit, a charge circuit, a discharge circuit, a digital capacitance having a plurality of electrostatic capacitances, a comparator for comparing a voltage inputted to the digital capacitance with a reference voltage, and a capacitance control circuit for controlling the digital capacitance. The time until the comparator detects that the voltage inputted to the digital capacitance is higher than the reference voltage after a reset signal has become a predetermined logic level is measured, and the digital capacitance is controlled by repeating, under a predetermined condition, processing for obtaining a next setting value of the digital capacitance, based on a measurement result, a target value of the digital capacitance, and the current value of the digital capacitance.

12 Claims, 6 Drawing Sheets

| DIGITAL VALUE | SW4 | SW3 | SW2 | SW1 | SW0 | DIGITAL CAPACITANCE VALUE |
|---|---|---|---|---|---|---|
| 0 | 0 | 0 | 0 | 0 | 0 | 0.68C |
| 1 | 0 | 0 | 0 | 0 | 1 | 0.70C |
| 2 | 0 | 0 | 0 | 1 | 0 | 0.72C |
| 3 | 0 | 0 | 0 | 1 | 1 | 0.74C |
| 4 | 0 | 0 | 1 | 0 | 0 | 0.76C |
| 5 | 0 | 0 | 1 | 0 | 1 | 0.78C |
| 6 | 0 | 0 | 1 | 1 | 0 | 0.80C |
| 7 | 0 | 0 | 1 | 1 | 1 | 0.82C |
| 8 | 0 | 1 | 0 | 0 | 0 | 0.84C |
| 9 | 0 | 1 | 0 | 0 | 1 | 0.86C |
| 10 | 0 | 1 | 0 | 1 | 0 | 0.88C |
| 11 | 0 | 1 | 0 | 1 | 1 | 0.90C |
| 12 | 0 | 1 | 1 | 0 | 0 | 0.92C |
| 13 | 0 | 1 | 1 | 0 | 1 | 0.94C |
| 14 | 0 | 1 | 1 | 1 | 0 | 0.96C |
| 15 | 0 | 1 | 1 | 1 | 1 | 0.98C |
| 16 | 1 | 0 | 0 | 0 | 0 | 1.00C |
| 17 | 1 | 0 | 0 | 0 | 1 | 1.02C |
| 18 | 1 | 0 | 0 | 1 | 0 | 1.04C |
| 19 | 1 | 0 | 0 | 1 | 1 | 1.06C |
| 20 | 1 | 0 | 1 | 0 | 0 | 1.08C |
| 21 | 1 | 0 | 1 | 0 | 1 | 1.10C |
| 22 | 1 | 0 | 1 | 1 | 0 | 1.12C |
| 23 | 1 | 0 | 1 | 1 | 1 | 1.14C |
| 24 | 1 | 1 | 0 | 0 | 0 | 1.16C |
| 25 | 1 | 1 | 0 | 0 | 1 | 1.18C |
| 26 | 1 | 1 | 0 | 1 | 0 | 1.20C |
| 27 | 1 | 1 | 0 | 1 | 1 | 1.22C |
| 28 | 1 | 1 | 1 | 0 | 0 | 1.24C |
| 29 | 1 | 1 | 1 | 0 | 1 | 1.26C |
| 30 | 1 | 1 | 1 | 1 | 0 | 1.28C |
| 31 | 1 | 1 | 1 | 1 | 1 | 1.30C |

| DIGITAL VALUE | DIGITAL CAPACITANCE VALUE | CUTOFF FREQUENCY |
|---|---|---|
| 0 | 0.68C | 7.35MHz |
| 1 | 0.70C | 7.14MHz |
| 2 | 0.72C | 6.94MHz |
| 3 | 0.74C | 6.76MHz |
| 4 | 0.76C | 6.58MHz |
| 5 | 0.78C | 6.41MHz |
| 6 | 0.80C | 6.25MHz |
| 7 | 0.82C | 6.10MHz |
| 8 | 0.84C | 5.95MHz |
| 9 | 0.86C | 5.81MHz |
| 10 | 0.88C | 5.68MHz |
| 11 | 0.90C | 5.56MHz |
| 12 | 0.92C | 5.43MHz |
| 13 | 0.94C | 5.32MHz |
| 14 | 0.96C | 5.21MHz |
| 15 | 0.98C | 5.10MHz |
| 16 | 1.00C | 5.00MHz |
| 17 | 1.02C | 4.90MHz |
| 18 | 1.04C | 4.81MHz |
| 19 | 1.06C | 4.72MHz |
| 20 | 1.08C | 4.63MHz |
| 21 | 1.10C | 4.55MHz |
| 22 | 1.12C | 4.46MHz |
| 23 | 1.14C | 4.39MHz |
| 24 | 1.16C | 4.31MHz |
| 25 | 1.18C | 4.24MHz |
| 26 | 1.20C | 4.17MHz |
| 27 | 1.22C | 4.10MHz |
| 28 | 1.24C | 4.03MHz |
| 29 | 1.26C | 3.97MHz |
| 30 | 1.28C | 3.91MHz |
| 31 | 1.30C | 3.85MHz |

# AUTOMATIC CUTOFF FREQUENCY ADJUSTING CIRCUIT AND PORTABLE DIGITAL ASSISTANT

CROSS-REFERENCE TO RELATED APPLICATIONS

The present application claims priority from Japanese patent application JP 2010-157703 filed on Jul. 12, 2010, the content of which is hereby incorporated by reference into this application.

BACKGROUND

The present invention relates to an automatic filter cutoff frequency adjusting technique, and particularly to a technique effective when applied to an automatic filter cutoff frequency adjusting circuit incorporated in, for example, a portable digital assistant.

Conventionally, a radio signal processing circuit is configured with discrete components of the respective functional blocks (an amplifier for amplifying a signal, a mixer for converting the frequency of the signal, a filter for passing only a desired band of the signal, and the like). However, recent semiconductor technology improvements have made it possible to incorporate the functional blocks configuring the radio signal processing circuit into one or more semiconductor chips. The radio signal processing circuit incorporated in the semiconductor chip converts a high-frequency signal received from an antenna into a signal of a lower frequency band with high quality (low noise, suppression of the signals of bands other than a desired signal band, and the like).

To achieve the radio signal processing circuit at low cost, it is necessary to incorporate more functional blocks configuring the radio signal processing circuit into one semiconductor chip. One of the obstacles to this objective is to incorporate a filter circuit for suppressing the signals of the undesired bands into the semiconductor chip. A SAW (Surface Acoustic Wave) filter, a dielectric filter, or the like is used as the filter circuit to suppress signals present in the bands other than the desired band. However, it is not possible to incorporate the SAW filter or the dielectric filter into the semiconductor chip.

In general, the radio signal processing circuit of discrete components is configured with a superheterodyne system which requires the SAW filter or the dielectric filter (see e.g. Non-patent Document 1 for the superheterodyne system); however, it is not possible to incorporate the SAW filter or the dielectric filter into the semiconductor chip. Accordingly, in the case where the radio signal processing circuit made of semiconductors is configured with the superheterodyne system, the SAW filter or the dielectric filter is provided outside the semiconductor chip, which increases the number of components and the mounting area.

There is proposed a radio signal processing circuit system that does not require the SAW filter or the dielectric filter, utilizing a feature of the semiconductor circuit that absolute component values vary among semiconductor chips whereas relative component values within one semiconductor chip coincide with each other with high accuracy. This system is a zero-IF system, a low-IF system, or the like, which does not require an external SAW filter or dielectric filter and suppresses signals present in the bands other than the desired band through the use of filters that can be incorporated into the semiconductor chip (it may be necessary that some filters be provided outside according to a radio system or system requirements).

In the zero-IF system and the low-IF system, a channel filter for eliminating signals other than a desired channel is disposed in a stage for processing the signal of a low frequency band after frequency conversion by a mixer circuit. By disposing the filter in the stage for processing the signal of the low frequency band, it becomes possible to implement filtering with a semiconductor circuit, namely, an active RC filter or the like in place of the SAW filter or the dielectric filter.

The channel filter suppresses signals present in a channel adjacent to the desired channel, a channel adjacent to the adjacent channel, and the like, that is, in the channels other than the desired channel. However, if a cutoff frequency which is a frequency having a gain of −3 dB from the DC gain of the channel filter shifts due to the manufacturing variation of the semiconductor, element temperatures, power supply voltage characteristics, etc., the received signal quality deteriorates.

For example, if the cutoff frequency shifts to the higher side, the degree of suppression of signals present in the adjacent channel, the channel adjacent to the adjacent channel, and the like deteriorates. If the cutoff frequency shifts to the lower side, the signal power of the desired channel decreases, so that the signal-to-noise ratio deteriorates, and the receiving sensitivity decreases. Further, in the case of receiving a digitally modulated signal, a deterioration in intersymbol interference characteristics affects the received data error rate.

Accordingly, a circuit for automatically adjusting the cutoff frequency of the channel filter is required, for example, as described in Patent Document 1. According to Patent Document 1, an automatic filter cutoff frequency adjusting circuit and a register for error correction are provided for each feedback capacitance and negative feedback capacitance (ground capacitance), thereby making it possible to adjust the filter cutoff frequency without increasing the error caused by the capacitance difference between the feedback capacitance and the negative feedback capacitance.

[Patent Document 1] Japanese Unexamined Patent Publication No. 2009-94734
[Non-patent Document 1] The Design of CMOS Radio-Frequency Integrated Circuits, CAMBRIDGE, written by Thomas H. Lee

SUMMARY

As described above, according to Patent Document 1, an automatic filter cutoff frequency adjusting circuit and a register for error correction are provided for each feedback capacitance and negative feedback capacitance (ground capacitance), thereby making it possible to adjust the filter cutoff frequency without increasing the error caused by the capacitance difference between the feedback capacitance and the negative feedback capacitance. This makes it possible to automatically adjust the filter cutoff frequency of a large capacitance ratio to be used and reduce the time required for the automatic adjustment.

To form a filter that supports various cutoff frequencies, a digital capacitance which can be adjusted over a wider range is required. The present inventors have studied the automatic cutoff frequency adjusting technique of the filter having such a digital capacitance, and have found the necessity to automatically adjust the cutoff frequency of the filter to an arbitrary setting value within the adjustment range by further improving the cutoff frequency calibration accuracy.

It is an object of the present invention to provide an automatic cutoff frequency adjusting circuit which can automatically adjust the cutoff frequency of a filter to an arbitrary setting value within the adjustment range and a portable digital assistant having the automatic cutoff frequency adjusting circuit.

The above and other objects and novel features of the present invention will be apparent from the description of this specification and the accompanying drawings.

A typical aspect of the invention disclosed in the present application will be briefly described as follows.

An automatic cutoff frequency adjusting circuit includes a voltage/current converter circuit, a charge circuit, a discharge circuit, a digital capacitance having a plurality of electrostatic capacitances, a comparator for comparing a voltage inputted to the digital capacitance with a reference voltage, and a capacitance control circuit for controlling the digital capacitance. The digital capacitance is coupled to the charge circuit and the discharge circuit through a switch, a reset signal is inputted to the switch and the capacitance control circuit, all or some of the electrostatic capacitances of the digital capacitance are coupled in parallel by switching, the digital capacitance is coupled to the discharge circuit when the reset signal is at a first level, and the digital capacitance is coupled to the charge circuit when the reset signal is at a second level. The capacitance control circuit measures a time until the comparator detects that the voltage inputted to the digital capacitance is higher than the reference voltage after the reset signal has become the second level, and controls the digital capacitance by repeating, under a predetermined condition, processing for obtaining a next setting value of the digital capacitance, based on a measurement result, a target value of the digital capacitance, and the current value of the digital capacitance.

A typical effect of the invention disclosed in the present application will be briefly described as follows.

It is possible to provide the automatic cutoff frequency adjusting circuit which can automatically adjust the cutoff frequency of a filter to an arbitrary setting value within the adjustment range and the portable digital assistant having the automatic cutoff frequency adjusting circuit.

DETAILED DESCRIPTION

1. Summary of the Embodiments

Figure 1:
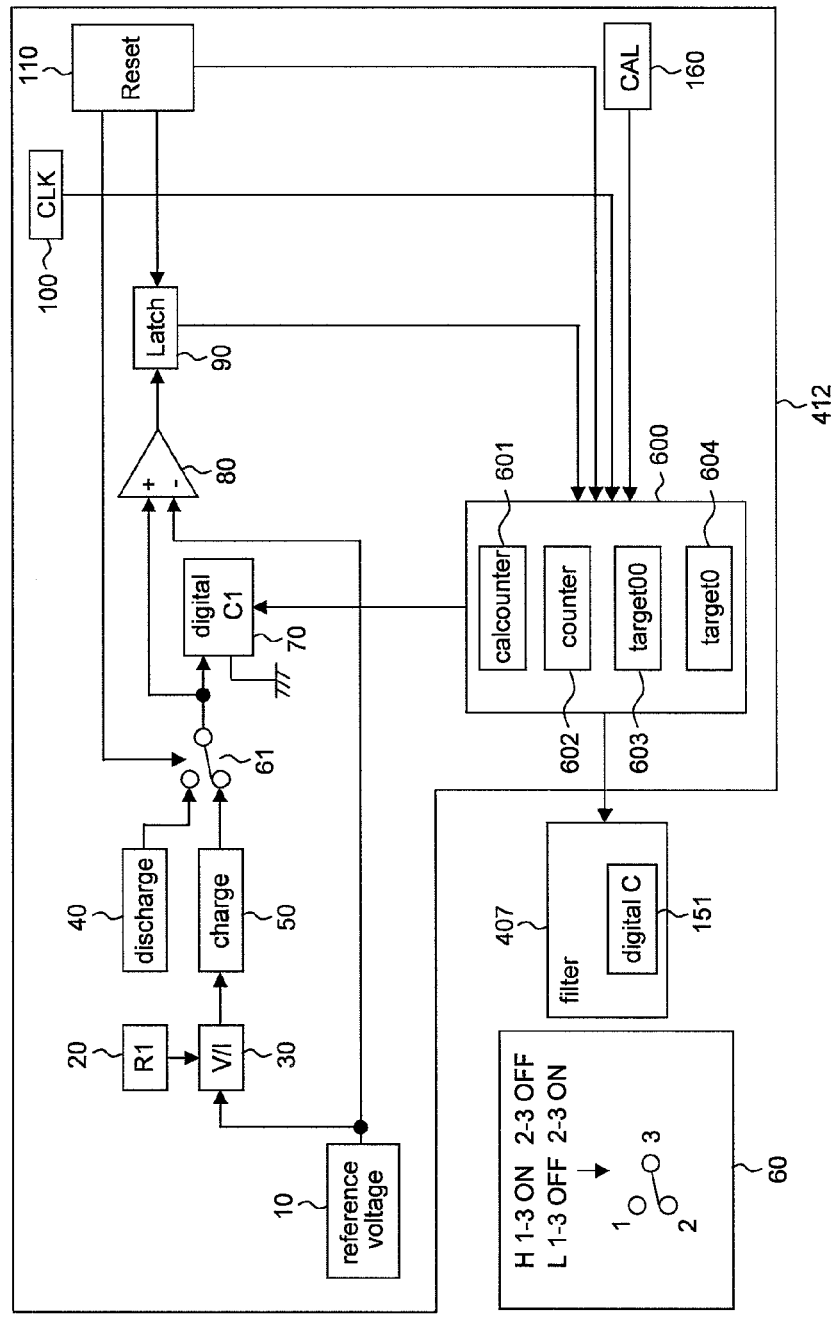
FIG. 1 is a block diagram showing a configuration example of an automatic cutoff frequency adjusting circuit according to a first embodiment of the present invention.

Summary of a typical embodiment of the invention disclosed in the present application will first be explained. Reference numerals in the drawings that refer to with parentheses applied thereto in the description of the summary of the typical embodiments are merely illustration of ones contained in the concepts of components marked with the reference numerals.

[1] An automatic cutoff frequency adjusting circuit (412) according to a typical embodiment of the invention includes a voltage/current converter circuit (30), a charge circuit (50), a discharge circuit (40), a digital capacitance (70) having a plurality of electrostatic capacitances, a comparator (80) for comparing a voltage inputted to the digital capacitance with a reference voltage, and a capacitance control circuit (600) for controlling the digital capacitance. The digital capacitance is coupled to the charge circuit and the discharge circuit through a switch, a reset signal is inputted to the switch and the capacitance control circuit, all or some of the electrostatic capacitances of the digital capacitance are coupled in parallel by switching, the digital capacitance is coupled to the discharge circuit when the reset signal is at a first level, and the digital capacitance is coupled to the charge circuit when the reset signal is at a second level. The capacitance control circuit measures a time until the comparator detects that the voltage inputted to the digital capacitance is higher than the reference voltage after the reset signal has become the second level, and controls the digital capacitance by repeating, under a predetermined condition, processing for obtaining a next setting value of the digital capacitance, based on a measurement result, a target value of the digital capacitance, and the current value of the digital capacitance.

According to the above configuration, the time until the comparator detects that the voltage inputted to the digital capacitance is higher than the reference voltage after the reset signal has become the second level is measured, and the digital capacitance is controlled by repeating, under the predetermined condition, processing for obtaining the next setting value of the digital capacitance, based on the measurement result, the target value of the digital capacitance, and the current value of the digital capacitance. Thus, a cutoff frequency is automatically adjusted, and the digital capacitance is adjusted to the target value. The target value can be an arbitrary setting value within the adjustment range.

[2] In item [1], the capacitance control circuit includes a first counter (calcounter; 601), a second counter (counter; 602), a first register (target00; 603), and a second register (target0; 604). The time until the comparator detects that the voltage inputted to the digital capacitance is higher than the reference voltage after the reset signal has become the second level is measured using the second counter, the target value of the digital capacitance is set to the first register, the next setting value of the digital capacitance is stored in the second register, and the processing for obtaining the next setting value of the digital capacitance is repeated using the first counter. This makes it possible to easily achieve the function of the capacitance control circuit of item [1].

[3] In item [2], the capacitance control circuit controls the digital capacitance so that a difference between a potential of the digital capacitance and the reference voltage falls within a predetermined potential difference, based on a comparison result by the comparator.

[4] In item [3], in the case of automatically adjusting the cutoff frequency of a channel filter circuit, the capacitance control circuit sets a digital capacitance within the channel filter circuit to the setting condition of the digital capacitance. Thereby, the cutoff frequency of the channel filter circuit is automatically adjusted.

[5] In item [4], to improve the calibration accuracy of the cutoff frequency, in the case where ΔC is the minimum capacitance step size of the digital capacitance and R1 is a resistance for converting a DC voltage into a current by the voltage/current converter circuit, the capacitance control circuit sets the digital capacitance within the channel filter circuit in synchronization with a clock signal, and the frequency of the clock signal is set to be greater than 1/(ΔC·R1).

[6] In item [4], the capacitance control circuit that supports a plurality of cutoff frequencies of the channel filter circuit has a plurality of target values as targets, a first digital capacitance setting value obtained by repeating the processing with a first target value corresponding to a first cutoff frequency is stored, and a second digital capacitance setting value obtained by repeating the processing with a second target value corresponding to a second cutoff frequency is stored. The capacitance control circuit uses the first digital capacitance setting value to set the first cutoff frequency, and the capacitance control circuit uses the second digital capacitance setting value to set the second cutoff frequency. This makes it possible to switch the cutoff frequencies at high speed.

[7] It is possible to incorporate the automatic cutoff frequency adjusting circuit of item [1] into a portable digital assistant. The portable digital assistant (801) incorporates the channel filter circuit (407), and the automatic cutoff frequency adjusting circuit automatically adjusts the cutoff frequency of the channel filter circuit.

2. Further Detailed Description of the Embodiments

Embodiments will be described in greater detail below.

First Embodiment

Figure 8:
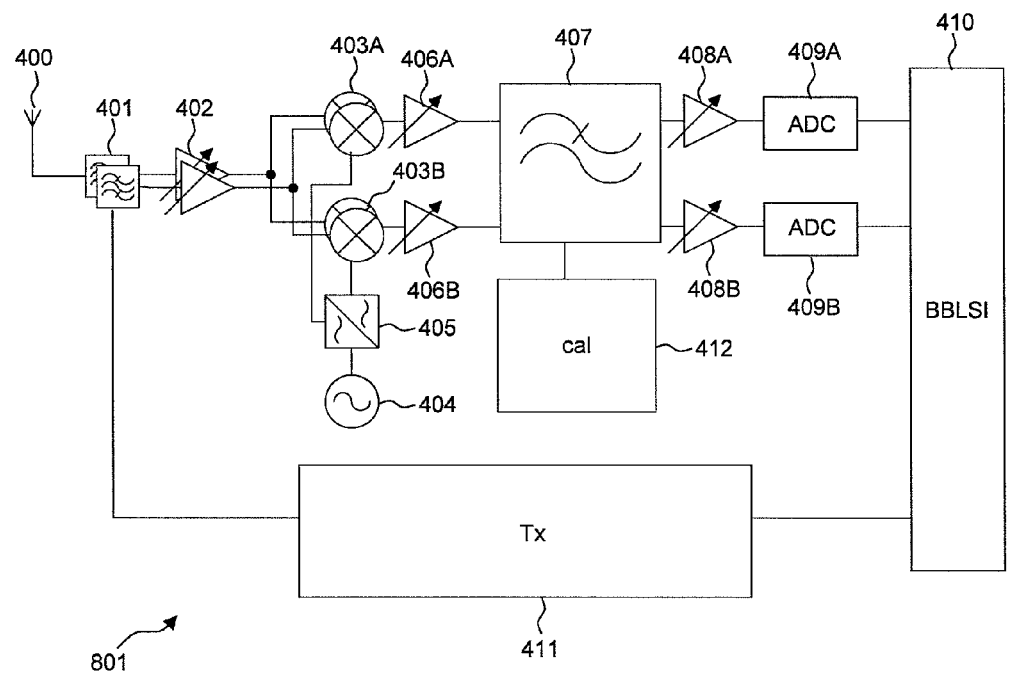
FIG. 8 is a block diagram showing a configuration example of a portable digital assistant incorporating the automatic cutoff frequency adjusting circuit according to the invention.

FIG. 8 shows a configuration example of a portable digital assistant according to the invention.

The portable digital assistant 801 includes an antenna 400, a duplexer 401, a low-noise amplifier (LNA) 402, mixers 403A and 403B, a local oscillation circuit 404, a 90-degree phase-shift circuit 405, first amplifier circuits 406A and 406B, a channel filter circuit 407, second amplifier circuits 408A and 408B, A/D (analog/digital) converter circuits 409A and 409B, a baseband LSI 410, a transmission circuit 411, and an automatic cutoff frequency adjusting circuit 412.

The duplexer 401 passes only a desired band of a signal received from the antenna 400. The LNA 402 amplifies the output signal of the duplexer 401 with low noise. The local oscillation circuit 404 oscillates at an integral multiple of a desired carrier frequency of the output signal of the duplexer 401. The 90-degree phase-shift circuit 405 outputs an output signal I of the local oscillation circuit 404 and a signal Q obtained by shifting the phase of the signal I by 90 degrees. The mixers 403A and 403B mix the output signal of the LNA 402 with the output signals of the 90-degree phase-shift circuit 405. The first amplifier circuits 406A and 406B amplify the output signals of the mixers 403A and 403B. The channel filter circuit 407 passes only a desired channel signal of the output signals of the first amplifier circuits 406A and 406B. The second amplifier circuits 408A and 408B amplify the output signals of the channel filter circuit 407. The A/D converter circuits 409A and 409B convert the output signals of the second amplifier circuits 408A and 408B into digital signals. The baseband LSI demodulates the output signals of the A/D converter circuits 409A and 409B to receive the signals. The transmission circuit 411 transmits a signal. That is, the transmission circuit 411 amplifies a modulated output from the baseband LSI 410, performs filtering and frequency conversion, and outputs the signal to the duplexer 401. The duplexer 401 passes only a desired transmission band of the signal conveyed from the transmission circuit 411. The signal that has passed through the duplexer 401 is transmitted from the antenna 400. The cutoff frequency of the channel filter circuit 407 is automatically adjusted by the automatic cutoff frequency adjusting circuit 412.

FIG. 1 shows a configuration example of the automatic cutoff frequency adjusting circuit 412.

Although not limited in particular, the automatic cutoff frequency adjusting circuit 412 includes a resistor 20, a voltage/current converter circuit (V/I) 30, a discharge circuit (discharge) 40, a charge circuit (charge) 50, a switch 61, a digital capacitance 70, a comparator 80, a latch circuit (Latch) 90, the channel filter circuit 407, and an arithmetic circuit 600.

A reference voltage source generates a reference voltage 10. The reference voltage 10 is a DC voltage VBG independent of process and temperature and power supply voltage. The value of the resistor 20 is R1. The voltage VBG is converted into a DC current I by the voltage/current converter circuit 30 and the resistor 20. The DC current I is expressed by the following equation.

$$I = VBG/R1 \quad (1)$$

The DC current I is conveyed to the charge circuit 50. The charge circuit 50 and the discharge circuit 40 are selectively coupled to the digital capacitance 70 by the switch 61. The operation of the switch 61 is controlled by a reset signal 110. Reference numeral 60 denotes a polarity diagram of the switch 61. According to this, if the reset signal 110 is at an H level (corresponding to logical value "1"), the discharge circuit 40 is selectively coupled to the digital capacitance 70, and if the reset signal 110 is at an L level (corresponding to logical value "0"), the charge circuit 50 is selectively coupled to the digital capacitance 70. The digital capacitance 70 is set by the arithmetic circuit 600. In this sense, the arithmetic circuit 600 is an example of a capacitance control circuit according to the invention. The channel filter circuit 407 includes a digital capacitance 151. The digital capacitance 151 is set by the arithmetic circuit 600 so that the value of the digital capacitance 151 is equal to that of the digital capacitance 70. The comparator 80 compares a level at the input terminal of the digital capacitance 70 with the reference voltage 10. That is, the comparator 80 compares a voltage (VBG/R1/C1×Δt) between the terminals of the digital capacitance 70 with the reference voltage 10 (VBG). The comparison result is held by the latch circuit 90. The output of the latch circuit 90 is supplied to the arithmetic circuit 600. The latch circuit 90 is initialized by the reset signal 110. The arithmetic circuit 600 includes a first counter (calcounter) 601, a second counter (counter) 602, a first register (target00) 603, and a second register (target0) 604.

Figures 3, 4:
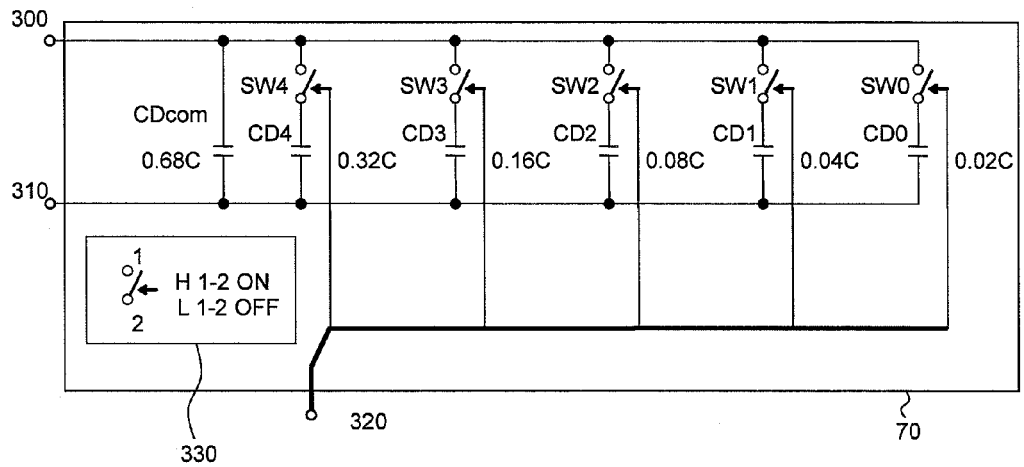
FIG. 3 is a circuit diagram showing a configuration example of a digital capacitance included in the automatic cutoff frequency adjusting circuit shown in FIG. 1.
FIG. 4 is a table of assistance in explaining the relationship between digital values inputted to the digital capacitance and capacitance values between the input and output terminals of the digital capacitance.

The digital capacitance 70 is configured as shown in FIG. 3.

The digital capacitance 70 shown in FIG. 3 includes a plurality of electrostatic capacitances (simply referred to as capacitances) CDcom and CD0 to CD4 and switches SW0 to SW4. The capacitances CD0 to CD4 are series-coupled to the respective switches SW0 to SW4. The operations of the switches SW0 to SW4 are controlled by a digital value conveyed through a digital-value input terminal 320. Reference numeral 300 denotes an input terminal, and reference numeral 310 denotes an output terminal. Further, reference numeral 330 denotes a polarity diagram of the switches SW0 to SW4. In this example, if the digital value conveyed through the digital-value input terminal 320 is logical value "1", the corresponding switch SW0 to SW4 is turned on. By the switching of the switches SW0 to SW4, all or some of the capacitances CDcom and CD0 to CD4 are coupled in parallel.

A thick line shown in FIG. 3 collectively represents five signal lines for five bits. It is possible to vary the capacitance value of the digital capacitance over a range of −32% to +30% in accordance with 5-bit digital values inputted through the digital-value input terminal 320.

To achieve a variable range of −32% to +30%, since the capacitance CDcom is a capacitance value when all the switches SW0 to SW4 are turned off (when the L-level signal is inputted to all the switches SW0 to SW4 through the digital-value input terminal 320 according to the switch polarity diagram 330), the value of the capacitance CDcom is 0.68 C. In this context, "C" denotes the center of capacitance values to be achieved by the digital capacitance. To achieve a variable range of −32% to +30% with 5 bits, the digital capacitance is varied in steps of 2%; therefore, the value of the capacitance CD4 is 0.32 C, the value of the capacitance CD3 is 0.16 C, the value of the capacitance CD2 is 0.08 C, and the value of the capacitance CD1 is 0.04 C.

FIG. 4 shows the relationship between values provided to the switches SW0 to SW4 in accordance with 5-bit digital values inputted through the digital-value input terminal 320 and capacitance values between the input terminal 300 and the output terminal 310. As shown in FIG. 4, the states of the switches SW0 to SW4 are controlled in accordance with the 5-bit digital values inputted through the digital-value input terminal 320, thereby changing the value of the digital capacitance 70 over a variable range of −32% to +30%.

Figures 5, 6:
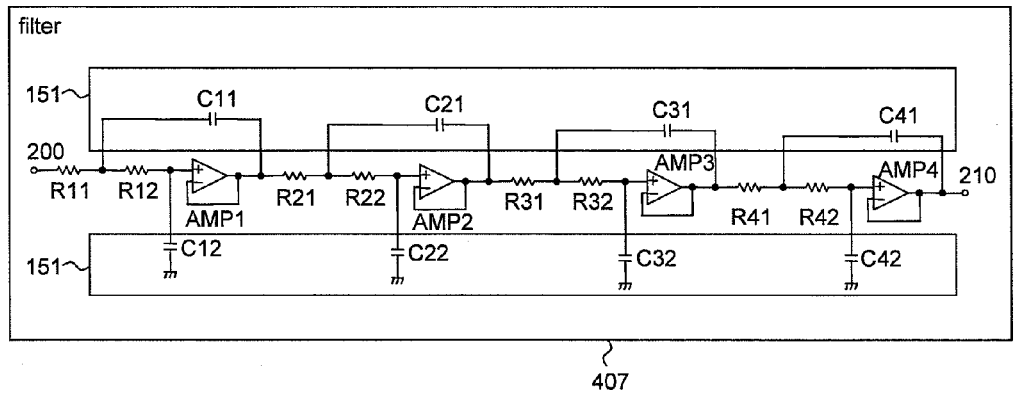
FIG. 5 is a circuit diagram showing a configuration example of a channel filter circuit included in the automatic cutoff frequency adjusting circuit shown in FIG. 1.
FIG. 6 is a table of assistance in explaining the relationship among digital values and digital capacitance values of the digital capacitance and cutoff frequencies.

FIG. 5 shows a configuration example of the channel filter circuit 407 shown in FIG. 1.

The channel filter circuit 407 shown in FIG. 5 is an eighth-order Butterworth low-pass filter configured with a positive feedback type low-pass circuit, and includes capacitances C11 to C42, resistors R11 to R42, and amplifiers AMP1 to AMP4. Reference numeral 200 denotes an input terminal, and reference numeral 210 denotes an output terminal. The operational amplifiers AMP1 to AMP4 are used as voltage followers. The input terminal is coupled through the resistors R11 and R12 to the non-inverting input terminal (+) of the amplifier AMP'. The output terminal of the amplifier AMP1 is coupled through the resistors R21 and R22 to the non-inverting input terminal (+) of the amplifier AMP2. The output terminal of the amplifier AMP2 is coupled through the resistors R31 and R32 to the non-inverting input terminal (+) of the amplifier AMP3. The output terminal of the amplifier AMP3 is coupled through the resistors R41 and R42 to the non-inverting input terminal (+) of the amplifier AMP4. The output terminal 210 is coupled to the amplifier AMP4. The capacitance C11 is coupled in parallel to the resistor R12 and the amplifier AMP1. The capacitance C21 is coupled in parallel to the resistor R22 and the amplifier AMP2. The capacitance C31 is coupled in parallel to the resistor R32 and the amplifier AMP3. The capacitance C41 is coupled in parallel to the resistor R42 and the amplifier AMP4. The capacitance C12 is coupled between the non-inverting input terminal (+) of the amplifier AMP1 and the ground. The capacitance C22 is coupled between the non-inverting input terminal (+) of the amplifier AMP2 and the ground. The capacitance C32 is coupled between the non-inverting input terminal (+) of the amplifier AMP3 and the ground. The capacitance C42 is coupled between the non-inverting input terminal (+) of the amplifier AMP4 and the ground.

The higher frequency band of a signal inputted through the input terminal 200 than a desired cutoff frequency is suppressed by the low-pass filter including the amplifiers AMP1 to AMP4, the capacitances C11 to C42, and the resistors R11 to R42, and the filtered signal is outputted through the output terminal 210. The cutoff frequency of the channel filter circuit 407 varies in proportion to $1/(2\pi$ resistance variation×capacitance variation).

The capacitances C11 to C42 shown in FIG. 5 are the digital capacitance 151, and the capacitance value is changed by the digital value provided from the arithmetic circuit 600, thereby making it possible to adjust the cutoff frequency of the filter.

Next, referring to a flowchart shown in FIG. 2, the operation of the above configuration will be described.

First, the reset signal 110 becomes the H level, so that the latch circuit 90 and the arithmetic circuit 600 are reset (S201). Then, the first register (target00) 603 in the arithmetic circuit 600 is set to an initial value (target value) "target value", the second register (target0) 604 in the arithmetic circuit 600 is set to the same value as the first register (target00) 603, and the first counter (calcounter) 601 is set to N (N is an integer equal to or greater than 1) (S202).

The value of the second register (target0) 604 is set to the switches SW0 to SW4 in the digital capacitance 70 (S203).

Since the reset signal 110 is at the H level in step S201, the digital capacitance 70 is coupled to the discharge circuit 40 through the switch 61, so that charge stored in the digital capacitance 70 is discharged by the discharge circuit 40, and the voltage between the terminals of the digital capacitance 70 becomes 0 V. Thereby, the output of the comparator 80 becomes the L level.

Then, the value of the second counter (counter) 602 is set to 0 (S204), and after a lapse of sufficient time for the discharge of the digital capacitance 70 (S205), the reset signal 110 becomes the L level (S206).

When the reset signal 110 becomes the L level, the digital capacitance 70 is coupled to the charge circuit 50 through the switch 61, so that the DC current (I=VBG/R1) which is the output of the voltage/current converter circuit 30 is supplied to the digital capacitance 70. A voltage V proportional to a time Δt after the reset signal 110 has become the L level appears between the terminals of the digital capacitance 70, as expressed by the following equation.

$$V = (VBG/R1/C1) \cdot \Delta t \tag{2}$$

where C1 denotes the capacitance value between the terminals of the digital capacitance 70.

If the voltage V is larger than the voltage VBG, the output of the comparator 80 becomes the H level. If the voltage V is smaller than the voltage VBG, the output of the comparator 80 becomes the L level.

Every time a rising edge or falling edge of a clock signal 100 is observed until the output of the comparator 80 becomes the H level after the reset signal 110 has becomes the L level, the value of the second counter (counter) 602 in the arithmetic circuit 600 is incremented by 1 (S207, S208). Therefore, the value of the second counter (counter) 602 in the arithmetic circuit 600 when the output of the comparator 80 has become the H level is equal to the total number of rising edges or falling edges of the clock signal 100 existing until the output of the comparator 80 becomes the H level after the reset signal 110 has become the L level.

A clock frequency Fc is expressed by the following equation in which ΔC is the minimum capacitance step size of the digital capacitance 70. As shown below, sufficient accuracy can be obtained.

$$Fc > 1/(\Delta C \cdot R1) \quad (3)$$

The second counter (counter) 602 in the arithmetic circuit 600 is incremented until the output of the latch circuit 90 becomes the H level by the output of the comparator 80 (S208, S209). When the output of the latch circuit 90 becomes the H level by the output of the comparator 80, the second register (target0) 604 in the arithmetic circuit 600 is updated to a value expressed by the following equation.

$$\text{target0} = \text{target00} - \text{counter} + \text{target0} \quad (4)$$

The new target0 value is set to the switches SW0 to SW4 in the digital capacitance 70 (S210). This calibrates the manufacturing variation of the resistance value R1 of the resistor 20 and the capacitance value C1 between the terminals of the digital capacitance 70, and the above digital value is provided to the switches SW0 to SW4 so as to make the product of R1 and C1 constant.

Then, the value of the first counter (calcounter) 601 in the arithmetic circuit 600 is decremented by 1 (S211), and it is determined whether or not the value of the first counter (calcounter) 601 is 0 (S212). If the value of the first counter (calcounter) 601 is not 0, the flow returns to step S203 to repeat the steps after step S203. The steps after step S203 are repeated until the value of the first counter (calcounter) 601 becomes 0. When the value of the first counter (calcounter) 601 becomes 0, a calibration end signal 160 is asserted. Thereby, the above digital value is set to the channel filter circuit 407 so as to calibrate the product of the resistance and the capacitance which determines the cutoff frequency of the filter circuit including the digital capacitance 151.

Thus, according to the first embodiment, the digital value for calibrating and making the product of R1 and C1 constant is determined by the arithmetic circuit 600, and the same digital value is provided to the capacitances C11 to C42 shown in FIG. 5, thereby setting the cutoff frequency of the channel filter circuit 407 to the target value.

FIG. 6 shows an example of cutoff frequencies obtained by applying digital values and capacitance values of the digital capacitance in FIG. 6 to FIG. 5 without the manufacturing variation of capacitance and resistance.

Figure 2:
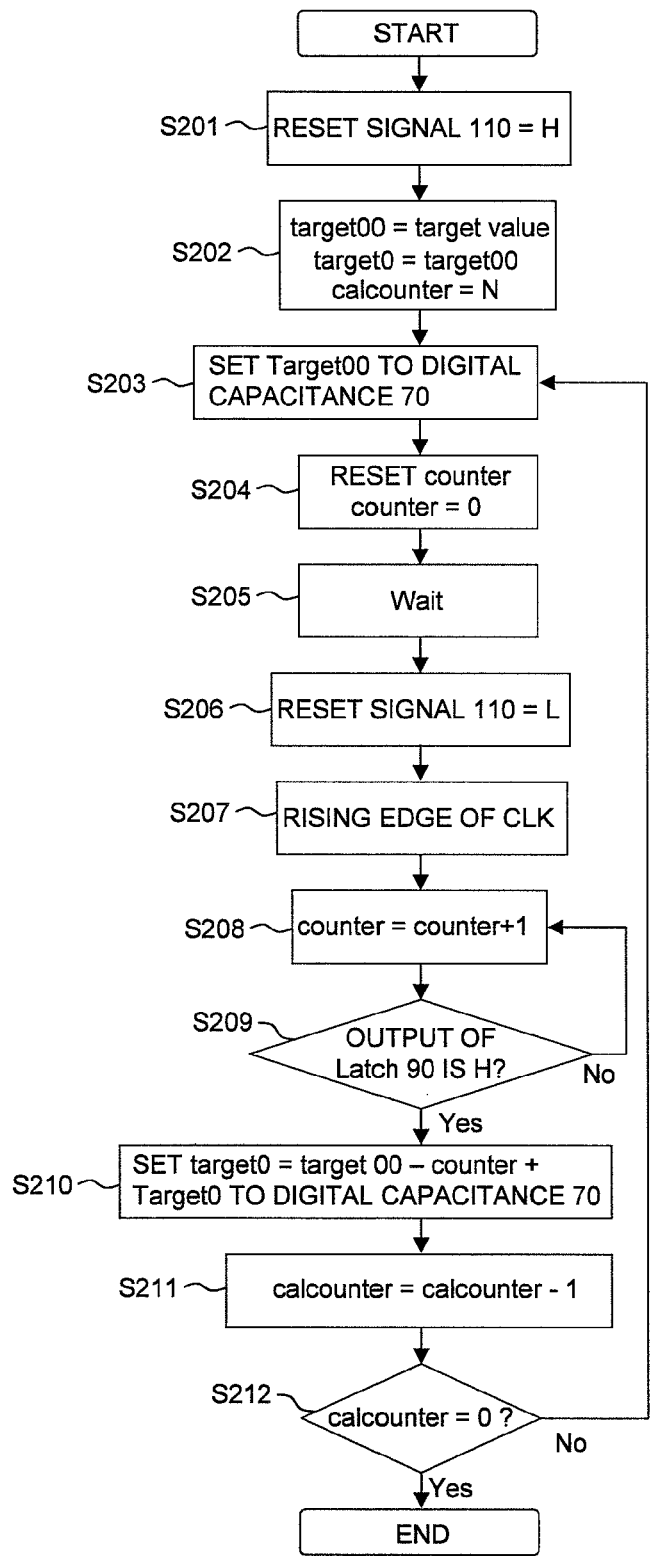
FIG. 2 is a flowchart of main processing in the automatic cutoff frequency adjusting circuit shown in FIG. 1.

For example, in the case of setting the cutoff frequency to 5 MHz, the initial value "target value" in step S202 in FIG. 2 is set to a digital value 16, the digital value for calibrating and making the product of R1 and C1 constant is determined by the arithmetic circuit 600, and the same digital value is provided to the capacitances C11 to C42 shown in FIG. 5, thereby automatically adjusting the cutoff frequency to a target frequency of 5 MHz.

Similarly, in the case of setting the cutoff frequency to 5.95 MHz, the initial value "target value" in step S202 in FIG. 2 is set to a digital value 8, the digital value for calibrating and making the product of R1 and C1 constant is determined by the arithmetic circuit 600, and the same digital value is provided to the capacitances C11 to C42 shown in FIG. 5, thereby automatically adjusting the cutoff frequency to a target frequency of 5.95 MHz.

In the case of switching a plurality of cutoff frequencies, the digital value obtained by the arithmetic circuit 600 when the initial value "target value" is set to the digital value 16 is stored beforehand as CA in the register or the like, and the digital value obtained by the arithmetic circuit 600 when the initial value "target value" in step S202 in FIG. 2 is set to the digital value 8 is stored beforehand as CB in the register or the like. In the case of setting the cutoff frequency of the circuit shown in FIG. 5 to 5 MHz, CA is provided to the digital value provided to the capacitances C11 to C42 shown in FIG. 5, and in the case of switching the cutoff frequency of the circuit shown in FIG. 5 to 5.95 MHz, the digital value provided to the capacitances C11 to C42 shown in FIG. 5 is switched to CB, thereby making it possible to switch the cutoff frequencies at high speed.

Second Embodiment

An automatic cutoff frequency adjusting circuit according to a second embodiment will be described.

The automatic cutoff frequency adjusting circuit according to the second embodiment differs from the circuit shown in FIG. 1 mainly in how to raise the calibration end signal 160.

Figure 7:
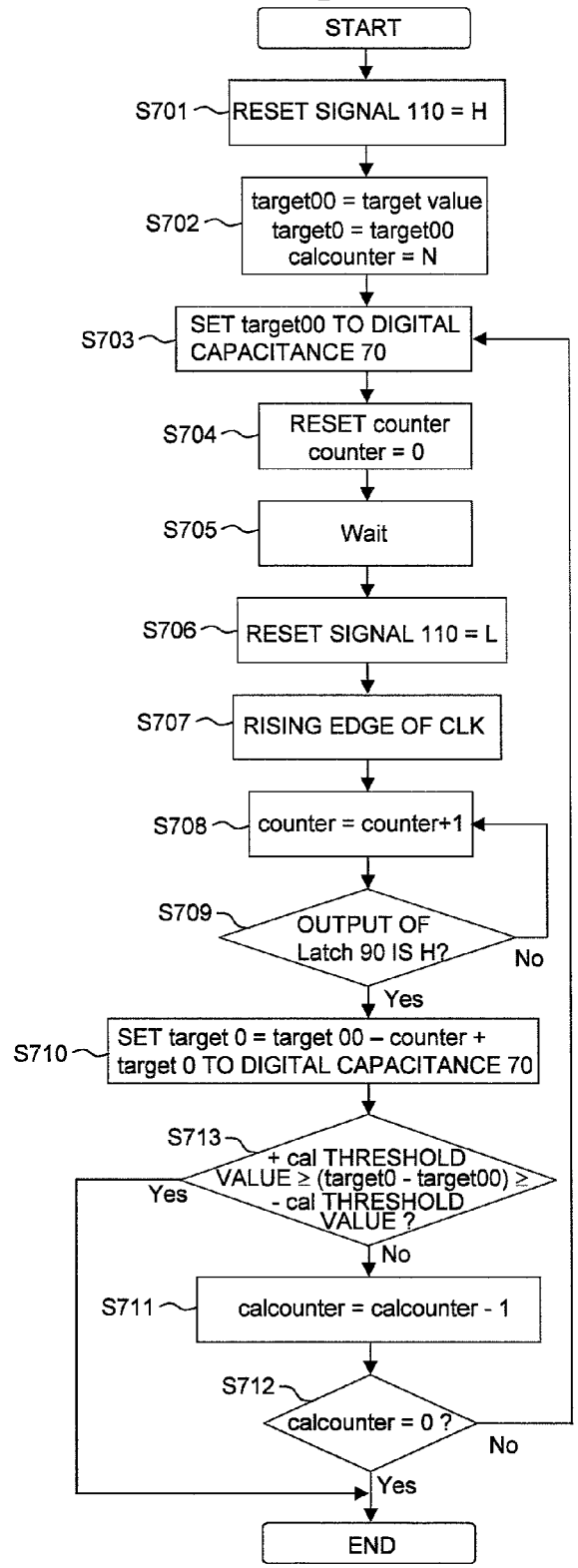
FIG. 7 is a flowchart of main processing in an automatic cutoff frequency adjusting circuit according to a second embodiment of the invention.

FIG. 7 shows a flowchart of main processing in the automatic cutoff frequency adjusting circuit according to the second embodiment. The flowchart shown in FIG. 7 differs from that shown in FIG. 2 mainly in the addition of determination in step S713. Steps S701 to S712 in the flowchart shown in FIG. 7 correspond to steps S201 to S212 in the flowchart shown in FIG. 2, and their detailed description is omitted.

After the new target0 value is set to the switches SW0 to SW4 in the digital capacitance 70 in step S710, it is determined whether or not the following equation holds, using preset +/− cal (calibration) threshold values, target0 and target00.

$$+\text{cal threshold value} \geq (\text{target0} - \text{target00}) \geq -\text{cal threshold value} \quad (5)$$

The cal threshold values relate to the accuracy and speed of calibration. As the range of the +/− cal threshold values narrows, the accuracy increases, but the processing time increases. If equation (5) holds, the processing in this flowchart ends, the calibration end signal 160 is asserted, and the digital value is provided to the channel filter circuit 407. If equation (5) does not hold, in step S711 the value of the first counter (calcounter) 601 in the arithmetic circuit 600 is decremented by 1 (S711).

Thus, if equation (5) holds in step S713 using the cal threshold values, the processing in this flowchart ends, the calibration end signal 160 is asserted, and the digital value is provided to the channel filter circuit 407, which can enhance the calibration speed. For example, in the case where there is no manufacturing variation, equation (6) holds; therefore, the arithmetic result of the arithmetic circuit 600 when the output of the comparator 80 has become the H level is expressed by equation (7).

$$\text{counter} = \text{target00} = (\text{target value}) \quad (6)$$

$$\begin{aligned}\text{target0} &= \text{target00} - \text{counter} + \text{target0} \\ &= \text{target00} - \text{target00} + \text{target00} = \text{target00}\end{aligned} \quad (7)$$

Assume that the + cal threshold value=+1, and the − cal threshold value=−1. In comparison with the +/− cal threshold values, "target0−target00=0" satisfies the condition of equation (5); therefore, it is possible to complete the calibration by setting the capacitance one time in the second embodiment. In the first embodiment, it is necessary to set the capacitance N times, whereas in the second embodiment, it is possible to complete the calibration by setting the capacitance one time, which enables the high-speed calibration.

Further, if "target0−target00" does not satisfy the condition of equation (5), with the first counter (calcounter) 601 it is possible to complete the calibration without fail by setting the capacitance N times as in the first embodiment.

While the invention made above by the present inventors has been described specifically based on the illustrated embodiments, the present invention is not limited thereto. It is needless to say that various changes and modifications can be made thereto without departing from the spirit and scope of the invention.

For example, the channel filter circuit 407 shown in FIG. 5 is not limited to the Butterworth filter. Even if the channel filter circuit 407 is a filter having arbitrary characteristics such as a Chebyshev filter, the automatic filter cutoff frequency adjusting circuit 412 shown in FIG. 1 can automatically adjust the cutoff frequency. Further, the channel filter circuit 407 shown in FIG. 5 is not limited to the positive feedback type low-pass circuit. Even if the channel filter circuit 407 has a different configuration such as a biquad filter, the automatic filter cutoff frequency adjusting circuit shown in FIG. 1 can automatically adjust the cutoff frequency.

Further, the reference voltage 10 generated by the reference voltage source is the DC voltage VBG independent of temperature and power supply voltage, but is not limited thereto. For example, the reference voltage 10 may be generated by dividing the power supply voltage through the use of resistors, which can generate the reference voltage 10 independent of temperature and power supply voltage in an environment with little fluctuation in power supply voltage.

What is claimed is:

1. An automatic cutoff frequency adjusting circuit comprising:
    a voltage/current converter circuit;
    a charge circuit;
    a discharge circuit;
    a digital capacitance having a plurality of electrostatic capacitances series-couples to corresponding switches;
    a comparator for comparing a voltage inputted to the digital capacitance with a reference voltage; and
    a capacitance control circuit for controlling the digital capacitance,
    wherein the voltage/current converter circuit converts the reference voltage into a DC current,
    wherein the DC current is inputted to the charger circuit,
    wherein the digital capacitance is coupled to the charge circuit and the discharge circuit through a switch,
    wherein a reset signal is inputted to the switch and the capacitance control circuit,
    wherein all or some of the electrostatic capacitances of the digital capacitance are coupled in parallel by switching the corresponding switches,
    wherein the digital capacitance is coupled to the discharge circuit when the reset signal is at a first level,
    wherein the digital capacitance is coupled to the charge circuit when the reset signal is at a second level, and
    wherein the capacitance control circuit measures a time until the comparator detects that a voltage between the terminals of the digital capacitance is higher than the reference voltage after the reset signal has become the second level, and controls the digital capacitance by repeating, under a predetermined condition, processing for obtaining a next setting value of the digital capacitance, based on a measurement result, a target value of the digital capacitance, and a current value of the digital capacitance.

2. The automatic cutoff frequency adjusting circuit according to claim 1,
    wherein the capacitance control circuit comprises a first counter, a second counter, a first register, and a second register,
    wherein the time until the comparator detects that the voltage inputted to the digital capacitance is higher than the reference voltage after the reset signal has become the second level is measured using the second counter,
    wherein the target value of the digital capacitance is set to the first register,
    wherein the next setting value of the digital capacitance is stored in the second register, and
    wherein the processing for obtaining the next setting value of the digital capacitance is repeated using the first counter.

3. The automatic cutoff frequency adjusting circuit according to claim 2,
    wherein the capacitance control circuit controls the digital capacitance so that a difference between a potential of the digital capacitance and the reference voltage falls within a predetermined potential difference, based on a comparison result by the comparator.

4. The automatic cutoff frequency adjusting circuit according to claim 3,
    wherein the automatic cutoff frequency adjusting circuit is connected to a channel filter circuit comprising another digital capacitance, and
    wherein the capacitance control circuit sets the digital capacitance of the channel filter circuit to the same setting condition as a setting condition of the digital capacitance of the automatic cutoff frequency adjusting circuit.

5. The automatic cutoff frequency adjusting circuit according to claim 4,
    wherein the capacitance control circuit sets the digital capacitance of the channel filter circuit in synchronization with a clock signal,
    wherein in the case where $\Delta C$ is a minimum capacitance step size of the digital capacitance and R1 is a resistance for converting a DC voltage into a current by the voltage/current converter circuit, and a frequency of the clock signal is set to be greater than $1/(\Delta C\ R1)$.

6. The automatic cutoff frequency adjusting circuit according to claim 4,
    wherein the capacitance control circuit that supports a plurality of cutoff frequencies of the channel filter circuit has a plurality of target values as targets, a first digital capacitance setting value obtained by repeating the processing with a first target value corresponding to a first cutoff frequency is stored, a second digital capacitance setting value obtained by repeating the processing with a second target value corresponding to a second cutoff frequency is stored, and
    wherein the capacitance control circuit uses the first digital capacitance setting value to set the first cutoff frequency, and the capacitance control circuit uses the second digital capacitance setting value to set the second cutoff frequency.

7. A portable digital assistant comprising an automatic cutoff frequency adjusting circuit,
    wherein the automatic cutoff frequency adjusting circuit comprising:
    a voltage/current converter circuit;
    a charge circuit;
    a discharge circuit;
    a digital capacitance having a plurality of electrostatic capacitances series-couples to corresponding switches;
    a comparator for comparing a voltage inputted to the digital capacitance with a reference voltage; and a capacitance control circuit for controlling the digital capacitance, wherein the voltage/current converter circuit converts the reference voltage into a DC current, wherein the DC current is inputted to the charge circuit, wherein the digital capacitance is coupled to the charge circuit and the discharge circuit through a switch, wherein a reset signal is inputted to the switch and the capacitance control circuit, wherein all or some of the electrostatic capacitances of the digital capacitance are coupled in parallel by switching the corresponding switchers, wherein the digital capacitance is coupled to the discharge circuit when the reset signal is at a first level, wherein the digital capacitance is coupled to the charge circuit when the reset signal is at a second level, and wherein the capacitance control circuit measures a time until the comparator detects that a voltage between the terminals of the digital capacitance is higher than the reference voltage after the reset signal has become the second level, and controls the digital capacitance by repeating, under a predetermined condition, processing for obtaining a next setting value of the digital capacitance, based on a measurement result, a target value of the digital capacitance, and a current value of the digital capacitance.

8. The portable digital assistant according to claim 7, wherein the capacitance control circuit comprises a first counter, a second counter, a first register, and a second register, wherein the time until the comparator detects that the voltage inputted to the digital capacitance is higher than the reference voltage after the reset signal has become the second level is measured using the second counter, wherein the target value of the digital capacitance is set to the first register, wherein the next setting value of the digital capacitance is stored in the second register, and wherein the processing for obtaining the next setting value of the digital capacitance is repeated using the first counter.

9. The portable digital assistant according to claim 8, wherein the capacitance control circuit controls the digital capacitance so that a difference between a potential of the digital capacitance and the reference voltage falls within a predetermined potential difference, based on a comparison result by the comparator.

10. The portable digital assistant according to claim 9, wherein the automatic cutoff frequency adjusting circuit is connected to a channel filter circuit comprising another digital capacitance, and wherein the capacitance control circuit sets the digital capacitance of the channel filter circuit to the same setting condition as a setting condition of the digital capacitance of the automatic cutoff frequency adjusting circuit.

11. The portable digital assistant according to claim 10, wherein the capacitance control circuit sets the digital capacitance of the channel filter circuit in synchronization with a clock signal, wherein in the case where $\Delta C$ is a minimum capacitance step size of the digital capacitance and R1 is a resistance for converting a DC voltage into a current by the voltage/current converter circuit, and a frequency of the clock signal is set to be greater than $1/(\Delta C\ R1)$.

12. The portable digital assistant according to claim 10, wherein the capacitance control circuit that supports a plurality of cutoff frequencies of the channel filter circuit has a plurality of target values as targets, a first digital capacitance setting value obtained by repeating the processing with a first target value corresponding to a first cutoff frequency is stored, a second digital capacitance setting value obtained by repeating the processing with a second target value corresponding to a second cutoff frequency is stored, and wherein the capacitance control circuit uses the first digital capacitance setting value to set the first cutoff frequency, and the capacitance control circuit uses the second digital capacitance setting value to set the second cutoff frequency.

\* \* \* \* \*